(12) United States Patent
Sim et al.

(10) Patent No.: US 10,017,646 B2
(45) Date of Patent: Jul. 10, 2018

(54) COMPOSITION FOR FORMING SILICA LAYER, METHOD FOR MANUFACTURING SILICA LAYER, AND ELECTRIC DEVICE INCLUDING SILICA LAYER

(71) Applicant: SAMSUNG SDI CO., LTD., Yongin-si, Gyeonggi-do (KR)

(72) Inventors: Sooyeon Sim, Suwon-si (KR); Jin-Hee Bae, Suwon-si (KR); TaekSoo Kwak, Suwon-si (KR); Yonggoog Kim, Suwon-si (KR); Jingyo Kim, Suwon-si (KR); Kunbae Noh, Suwon-si (KR); Huichan Yun, Suwon-si (KR); Jiho Lee, Suwon-si (KR); Byeong Gyu Hwang, Suwon-si (KR)

(73) Assignee: SAMSUNG SDI CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/656,341

(22) Filed: Jul. 21, 2017

(65) Prior Publication Data

US 2018/0163055 A1    Jun. 14, 2018

(30) Foreign Application Priority Data

Dec. 8, 2016 (KR) .......................... 10-2016-0166797

(51) Int. Cl.
| | |
|---|---|
| C01B 33/12 | (2006.01) |
| C09D 1/00 | (2006.01) |
| C09D 7/00 | (2018.01) |
| C09D 7/12 | (2006.01) |
| H01L 21/02 | (2006.01) |

(52) U.S. Cl.
CPC .............. C09D 1/00 (2013.01); C01B 33/12 (2013.01); C09D 7/001 (2013.01); C09D 7/1233 (2013.01); H01L 21/02164 (2013.01); H01L 21/02282 (2013.01); H01L 21/02318 (2013.01)

(58) Field of Classification Search
None
See application file for complete search history.

(56) References Cited

U.S. PATENT DOCUMENTS

| | | | |
|---|---|---|---|
| 5,169,908 A | 12/1992 | Zank | |
| 6,759,495 B2* | 7/2004 | Su | C08L 25/08 526/262 |
| 7,790,292 B2 | 9/2010 | Colborn et al. | |
| 9,169,353 B2* | 10/2015 | Ono | H01L 23/293 |
| 2004/0054079 A1* | 3/2004 | Su | C08L 25/08 525/70 |
| 2014/0367868 A1* | 12/2014 | Ono | H01L 23/293 257/788 |
| 2015/0337168 A1 | 11/2015 | Bae et al. | |
| 2016/0049343 A1* | 2/2016 | Kayaba | C08L 79/02 438/127 |
| 2016/0225615 A1 | 8/2016 | Hunks et al. | |
| 2017/0162382 A1* | 6/2017 | Kayaba | H01L 21/02082 |
| 2017/0372993 A1* | 12/2017 | Kayaba | H01L 23/53295 |

FOREIGN PATENT DOCUMENTS

| | | |
|---|---|---|
| JP | H 05-320356 A | 12/1993 |
| JP | H 06-322133 A | 11/1994 |
| JP | 2008-088224 A | 4/2008 |
| JP | 2012-532207 A | 12/2012 |
| KR | 10-0241988 B1 | 11/1999 |
| KR | 10-2011-0023411 A | 3/2011 |
| KR | 10-2011-0062158 A | 6/2011 |
| KR | 10-2012-0056289 A | 6/2012 |
| KR | 10-2014-0024342 A | 2/2014 |
| KR | 10-2014-0129996 A | 11/2014 |
| TW | 201639922 A | 11/2016 |

OTHER PUBLICATIONS

Search Report dated May 2, 2018, attached to the Office Action dated May 11, 2018 of the corresponding Taiwanese Patent Application No. 106125976.

* cited by examiner

*Primary Examiner* — David E Graybill
(74) *Attorney, Agent, or Firm* — Lee & Morse, P.C.

(57) ABSTRACT

A composition for forming silica layer includes a silicon-containing polymer and a solvent, wherein a weight average molecular weight of the silicon-containing polymer ranges from about 2,000 to about 100,000 and a branching ratio (a) of the silicon-containing polymer calculated by Equation 1 ranges from about 0.25 to about 0.50.

$$\eta = k \cdot M^a \quad \text{[Equation 1]}$$

In Equation 1,
η is an intrinsic viscosity of a silicon-containing polymer,
M is an absolute molecular weight of a silicon-containing polymer,
a is a branching ratio, and
k is an intrinsic constant.

8 Claims, No Drawings

COMPOSITION FOR FORMING SILICA LAYER, METHOD FOR MANUFACTURING SILICA LAYER, AND ELECTRIC DEVICE INCLUDING SILICA LAYER

CROSS-REFERENCE TO RELATED APPLICATION

Korean Patent Application No. 10-2016-0166797, filed on Dec. 8, 2016, in the Korean Intellectual Property Office, and entitled: "Composition for Forming Silica Layer, Method for Manufacturing Silica Layer, and Electric Device Including Silica Layer," is incorporated by reference herein in its entirety.

BACKGROUND OF THE INVENTION

1. Field

Embodiments relate to a composition for forming a silica layer, a method for manufacturing a silica layer, and an electronic device including the silica layer.

2. Description of the Related Art

A flat panel display uses a thin film transistor (TFT) including a gate electrode, a source electrode, a drain electrode and a semiconductor as a switching device and may be equipped with a gate line transferring a scan signal for controlling the thin film transistor and a data line transferring a signal applied to a pixel electrode.

SUMMARY

Embodiments are directed to a composition for forming a silica layer, a method for manufacturing a silica layer, and an electronic device including the silica layer.

The embodiments may be realized by providing a composition for forming a silica layer, the composition including a silicon-containing polymer; and a solvent, wherein a weight average molecular weight of the silicon-containing polymer is about 2,000 to about 100,000 and a branching ratio (a) of the silicon-containing polymer calculated by Equation 1 is about 0.25 to about 0.50:

$$\eta = k \cdot M^a \quad \text{[Equation 1]}$$

wherein, in Equation 1, $\eta$ is an intrinsic viscosity of the silicon-containing polymer, M is an absolute molecular weight of the silicon-containing polymer, a is the branching ratio, and k is an intrinsic constant.

The intrinsic viscosity of the silicon-containing polymer may be about 3 mg/L to about 15 mg/L.

The absolute molecular weight of the silicon-containing polymer may be about 2,000 g/mol to about 300,000 g/mol.

The silicon-containing polymer may include a polysilazane, a polysiloxazane, or a combination thereof.

The solvent may include benzene, toluene, xylene, ethylbenzene, diethylbenzene, trimethylbenzene, triethylbenzene, cyclohexane, cyclohexene, decahydronaphthalene, dipentene, pentane, hexane, heptane, octane, nonane, decane, ethylcyclohexane, methylcyclohexane, cyclohexane, cyclohexene, p-menthane, dipropylether, dibutylether, anisole, butyl acetate, amyl acetate, methylisobutylketone, or a combination thereof.

The silicon-containing polymer may be included in the composition in an amount of about 0.1 wt % to about 30 wt %, based on a total weight of the composition for forming a silica layer.

The embodiments may be realized by providing a method of manufacturing a silica layer, the method including coating the composition for forming a silica layer according to an embodiment on a substrate, drying the substrate coated with the composition for forming a silica layer, and curing the composition for forming a silica layer at about 250° C. to about 1,000° C.

The embodiments may be realized by providing an electronic device including the silica layer according to an embodiment.

DETAILED DESCRIPTION

Example embodiments will now be described more fully hereinafter; however, they may be embodied in different forms and should not be construed as limited to the embodiments set forth herein. Rather, these embodiments are provided so that this disclosure will be thorough and complete, and will fully convey exemplary implementations to those skilled in the art.

It will also be understood that when a layer or element is referred to as being "on" another layer or element, it can be directly on the other layer or element, or intervening layers may also be present. In addition, it will also be understood that when a layer is referred to as being "between" two layers, it can be the only layer between the two layers, or one or more intervening layers may also be present.

As used herein, when a definition is not otherwise provided, 'substituted' refers to replacement of hydrogen of a compound by a substituent selected from a halogen atom (F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, phosphoric acid or a salt thereof, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 hetero alkyl group, a C2 to C20 heteroaryl group, a C3 to C20 heteroarylalkyl group, a C3 to C30 cycloalkyl group, a C3 to C15 cycloalkenyl group, a C6 to C15 cycloalkynyl group, a C2 to C30 hetero cycloalkyl group, and a combination thereof.

As used herein, when a definition is not otherwise provided, the term 'hetero' refers to one including 1 to 3 heteroatoms selected from N, O, S, and P.

In addition, in the specification, the mark "*" refers to where something is connected with the same or different atom or chemical formula (e.g., a bonding location to an adjacent atom).

Hereinafter, a composition for forming a silica layer according to an embodiment is described.

A composition for forming a silica layer according to an embodiment may include, e.g., a silicon-containing polymer and a solvent wherein the silicon-containing polymer has a weight average molecular weight of about 2,000 to about 100,000 and a branching ratio of about 0.25 to about 0.50.

Herein, the branching ratio is calculated by Equation 1 that is referred to as Mark-Houwink-Sakurada equation.

$$\eta = k \cdot M^a \quad \text{[Equation 1]}$$

In Equation 1,

η is an intrinsic viscosity of a silicon-containing polymer,

M is an absolute molecular weight of a silicon-containing polymer, a is a branching ratio, and k is an intrinsic constant.

In Equation 1 (Mark-Houwink-Sakurada equation), the branching ratio (a) corresponds to a slope of a plot.

When a polymer has a large branching ratio, the polymer may have plenty of linear structures and may be less dense. When a polymer has a small branching ratio, the polymer may have a high cross-linking degree and a dense structure. Accordingly, the branching ratio of the polymer may be a factor showing layer denseness of the polymer.

According to an embodiment, a silicon-containing polymer included in a composition for forming a silica layer may be designed to have a weight average molecular weight within a predetermined range and simultaneously, a structure satisfying a branching ratio within a predetermined range.

Accordingly, the composition for forming a silica layer may simultaneously secure etch resistance and planarization of a layer formed thereof. In addition, the composition may reduce shrinkage and stress of the layer and may help realize a layer having high quality.

As described above, the branching ratio (a) of the silicon-containing polymer may be calculated by the Mark-Houwink-Sakurada equation, wherein the intrinsic viscosity and the absolute molecular weight of the silicon-containing polymer is measured and then the branching ratio is calculated by the Mark-Houwink-Sakurada equation using the measured intrinsic viscosity and absolute molecular weight.

In Equation 1, k is an intrinsic constant.

An absolute molecular weight (LS detector) and an intrinsic viscosity value of a material may be measured by GPC, may be put in a program (Astra software), and the branching ratio and the intrinsic constant k may be obtained or may be obtained by the Mark-Houwink-Sakurada equation by taking a Log value.

In an implementation, the branching ratio (a) of the silicon-containing polymer may be, e.g., about 0.25 to about 0.50, about 0.26 to about 0.50, about 0.27 to about 0.50, or about 0.28 to about 0.50.

In an implementation, the intrinsic viscosity of the silicon-containing polymer may be, e.g., about 3 to about 15 (mg/L), and the absolute molecular weight may be, e.g., about 2,000 g/mol to about 300,000 g/mol or about 2,000 to about 200,000 g/mol.

The silicon-containing polymer may include, e.g., a polysilazane, a polysiloxazane, or a combination thereof. In an implementation, the silicon-containing polymer may have a number average molecular weight of, e.g., about 500 to about 10.000.

In an implementation, the silicon-containing polymer may include, e.g., a moiety represented by Chemical Formula A.

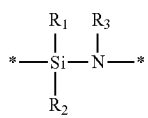

[Chemical Formula A]

In Chemical Formula A, $R_1$ to $R_3$ may each independently be or include, e.g., hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 hetero alkyl group, a substituted or unsubstituted C2 to C30 heterocycloalkyl group, a substituted or unsubstituted C2 to C30 alkenyl group, a substituted or unsubstituted alkoxy group, a carboxyl group, an aldehyde group, a hydroxy group, or a combination thereof, and "*" indicates a linking point.

For example, the silicon-containing polymer may be polysilazane produced by reacting halosilane with ammonia.

In an implementation, the silicon-containing polymer of the composition for forming silica layer may further include, e.g., a moiety represented by Chemical Formula B in addition to the moiety represented by Chemical Formula A.

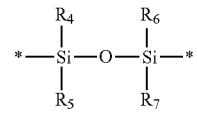

[Chemical Formula B]

$R_4$ to $R_7$ of Chemical Formula B may each independently be or include, e.g., hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 hetero alkyl group, a substituted or unsubstituted C2 to C30 heterocycloalkyl group, a substituted or unsubstituted C2 to C30 alkenyl group, a substituted or unsubstituted alkoxy group, a carboxyl group, an aldehyde group, a hydroxy group, or a combination thereof, and "*" indicates a linking point.

In this case, the silicon-containing polymer may include a silicon-oxygen-silicon (Si—O—Si) bond moiety in its structure in addition to a silicon-nitrogen (Si—N) bond moiety. The silicon-oxygen-silicon (Si—O—Si) bond moiety may help weaken or relieve stress during curing by a heat treatment and reduce shrinkage.

In an implementation, the silicon-containing polymer may include, e.g., the moiety represented by Chemical Formula A and the moiety represented by Chemical Formula B, and may further include a moiety represented by Chemical Formula C.

 *—SiH$_3$  [Chemical Formula C]

The moiety represented by Chemical Formula C has a structure where the terminal end is capped with hydrogen, and may be included in an amount of about 15 to about 35 wt % based on a total weight of the Si—H bonds in the polysilazane or polysiloxazane structure. When the moiety of Chemical Formula C is included in the polysilazane or polysiloxazane structure within the range, a SiH$_3$ moiety may be prevented from being scattered into SiH$_4$ while an oxidation reaction sufficiently occurs during the heat treatment, and a crack in a filler pattern may be advantageously prevented.

In an implementation, the silicon-containing polymer may be included in an amount of about 0.1 wt % to about 30 wt %, based on a total weight of the composition for forming a silica layer.

The solvent of the composition for forming a silica layer may be a suitable solvent in which the silicon-containing polymer is soluble, e.g., benzene, toluene, xylene, ethylbenzene, diethylbenzene, trimethylbenzene, triethylbenzene, cyclohexane, cyclohexene, decahydro naphthalene, dipentene, pentane, hexane, heptane, octane, nonane, decane, ethylcyclohexane, methylcyclohexane, cyclohexane, cyclohexene, p-menthane, dipropylether, dibutylether, anisole, butyl acetate, amyl acetate, methylisobutylketone, or a combination thereof.

The composition for forming a silica layer may further include a thermal acid generator (TAG).

The thermal acid generator may be an additive to help improve developing a property of the composition for forming a silica layer, and thus may facilitate development of the polymer of the composition at a relatively low temperature.

The thermal acid generator may include a suitable compound that generates acid ($H^+$) by heat. For example, it may include a compound activated at 90° C. or higher and generating sufficient acid and also, having low volatility.

The thermal acid generator may include, e.g., nitrobenzyl tosylate, nitrobenzyl benzenesulfonate, phenol sulfonate, or a combination thereof.

The thermal acid generator may be included in an amount of about 0.01 to about 25 wt %, based on the total weight of the composition for forming a silica layer. Within the range, the polymer may be developed at a low temperature and simultaneously may have improved coating properties.

In an implementation, the composition for forming a silica layer may further include a surfactant.

In an implementation, the surfactant may include, e.g., a non-ionic surfactant of polyoxyethylenealkyl ethers such as polyoxyethylenelauryl ether, polyoxyethylenestearyl ether, polyoxyethylenecetyl ether, polyoxyethyleneoleyl ether, and the like, polyoxyethylenealkylallyl ethers such as polyoxyethylenenonylphenol ether, and the like, polyoxyethylene polyoxypropylene block copolymers, polyoxyethylene sorbitan fatty acid ester such as sorbitan monolaurate, sorbitan monopalmitate, sorbitan monostearate, sorbitan monooleate, polyoxyethylene sorbitan monostearate, polyoxyethylene sorbitan trioleate, polyoxyethylene sorbitan tristearate, and the like, a fluorine-based surfactant of EFTOP EF301, EF303, EF352 (Tochem Products Co., Ltd.), MEGAFACE F171, F173 (Dainippon Ink & Chem., Inc.), FLUORAD FC430, FC431 (Sumitomo 3M), Asahi guardAG710, Surflon S-382, SC101, SC102, SC103, SC104, SC105. SC106 (Asahi Glass Co., Ltd.), and the like; other silicone-based surfactant such as an organosiloxane polymer KP341 (Shin-Etsu Chemical Co., Ltd.), or the like.

The surfactant may be included in an amount of about 0.001 to about 10 wt %, based on the total weight of the composition for forming a silica layer. Within the range, dispersion of a solution and simultaneously uniform thickness of a layer may be improved.

According to another embodiment, a method for manufacturing a silica layer may include coating the composition for forming a silica layer, drying the substrate coated with the composition for forming a silica layer, and curing the composition for forming a silica layer.

In an implementation, the composition for forming a silica layer may be coated using a solution process such as a spin-on coating method, slit coating, inkjet printing.

In an implementation, the substrate may be, e.g., a device substrate such as a semiconductor, a liquid crystal and the like.

After coating of the composition for forming a silica layer is completed, subsequently the substrate may be dried and cured. The drying and curing process may be performed, e.g., at a temperature of greater than or equal to about 100° C., and may be performed by applying energy, e.g., heat, ultraviolet (UV), a microwave, a sound wave, an ultrasonic wave, or the like.

In an implementation, the drying may be performed at about 100° C. to about 200° C., and through the drying, a solvent may be removed from the composition for forming a silica layer. In an implementation, the curing may be performed at about 250° C. to about 1,000° C., and through the curing, the composition for forming a silica layer may be converted into a thin oxide film. In an implementation, the curing may be performed, e.g., primarily at about 250° C. to about 1,000° C. under an aqueous vapor atmosphere and secondarily at about 600° C. to about 1,000° C. under an nitrogen atmosphere.

According to another embodiment, a silica layer manufactured by the method is provided. The silica layer may be, for example an insulation layer, a separation layer, or a hard coating layer, but is not limited thereto.

According to yet another embodiment, an electronic device including the silica layer manufactured by the method is provided. The electronic device may be, for example a display device such as an LCD or an LED, or a semiconductor device.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Preparation of Composition for Forming Silica Layer

Comparative Example 1

A 1 L reactor equipped with a stirrer and a temperature controller was internally exchanged with dry nitrogen. Subsequently, 800 g of dry pyridine was put in the reactor and kept at −1° C. Then, 60 g of dichlorosilane was slowly injected thereinto over one hour. 37 g of ammonia was slowly injected thereinto over 2 hours while the obtained mixture was stirred. Subsequently dry nitrogen was injected thereinto for 120 minutes, and the ammonia remaining in the reactor was removed. The obtained white slurry product was filtered with a 0.1 µm Teflon filter under a dry nitrogen atmosphere to obtain 1,400 g of a filtered solution. 800 g of dry xylene was added thereto, a solid concentration was adjusted into 20 wt %, while a solvent substitution from the pyridine to xylene was repeated three times by using a rotary evaporator, and the solid therein was filtered with a Teflon filter having a pore size of 0.1 µm to obtain a solution of an inorganic polysilazane polymer having a weight average molecular weight of 1,500.

Example 1

A 1 L reactor equipped with a stirrer and a temperature controller was internally exchanged with dry nitrogen. Subsequently, 800 g of dry pyridine was put in the reactor and kept at −1° C. Then, 60 g of dichlorosilane was slowly injected thereinto over one hour, and 37 g of ammonia was slowly injected over 2 hours, while the mixture was stirred. Subsequently, the ammonia remaining in the reactor was removed by injecting dry nitrogen thereinto over 120 minutes. The obtained white slurry product was filtered with a 0.1 µm Teflon filter under a dry nitrogen atmosphere to obtain 1,400 g of a filtered solution. Subsequently, 800 g of dry xylene was added thereto, a solid concentration was adjusted into 20 wt %, while a solvent substitution from the xylene to pyridine was repeated three times with a rotary evaporator, and the solid therein was filtered with a Teflon filter having a pore size of 0.1 μm to obtain a solution of an inorganic polysilazane polymer having a weight average molecular weight of 2,000. (Weight average molecular weight: GPC; HPLC Pump 1515 made by Waters Corp.).

Examples 2 to 6 and Comparative Examples 2 to 4

A solution of an inorganic polysilazane polymer having each weight average molecular weight shown in Table 1 was obtained by adding 250 g of dry pyridine to the xylene-substituted inorganic polysilazane solution of Example 1, heating the mixture at 100° C., repeating a solvent substitution from the xylene to dibutyl ether at 70° C. with a rotary evaporator four times when a polymerization was complete in order to adjust a solid concentration into 20 wt %, and additionally filtering the resultant with a 0.1 μm Teflon filter.

Then, each intrinsic viscosity and absolute molecular weight was measured in the same method as Example 1, and the results are shown in Table 1.

Measurement of Intrinsic Viscosity and Absolute Molecular Weight

Each inorganic polysilazane polymer solution according to Examples 1 to 6 and Comparative Examples 1 to 4 was diluted with moisture-treated THF (tetrahydrofuran) to have a concentration of 1% to obtain each sample. Subsequently, intrinsic viscosity and absolute molecular weight of the samples were measured by using an online differential viscometer (ViscoStar made by Wyatt Tech. Corp.) and a multi angle light scattering system (DAWN HELEOS) (Herein, polystyrene Mw 285,000±15000 (NIST SRM 706a) was used as a standard specimen).

The results are shown in Table 1.

Evaluation 1: Calculation of Branching Ratio

Each branching ratio of an inorganic polysilazane polymer included in the inorganic polysilazane polymer solutions according to Examples 1 to 6 and Comparative Examples 1 to 4 was calculated according to Equation 1, and the results are shown in Table 1.

$$\eta = k \cdot M^a \quad \text{[Equation 1]}$$

In Equation 1,
η is an intrinsic viscosity of a silicon-containing polymer,
M is an absolute molecular weight of a silicon-containing polymer,
a is a branching ratio, and
k is an intrinsic constant.

The results are shown in Table 1.

TABLE 1

| | Weight average molecular weight (g/mol) | Intrinsic viscosity (mg/L) | Absolute molecular weight (g/mol) | Branching ratio |
|---|---|---|---|---|
| Example 1 | 2,000 | 3.5 | 2,500 | 0.497 |
| Example 2 | 5,000 | 4 | 6,000 | 0.341 |
| Example 3 | 20,000 | 6 | 3,6000 | 0.286 |
| Example 4 | 40,000 | 7.5 | 97,800 | 0.277 |
| Example 5 | 60,000 | 7.9 | 169,600 | 0.264 |
| Example 6 | 100,000 | 12 | 300,000 | 0.251 |
| Comparative Example 1 | 1,500 | 3.5 | 2,500 | 0.513 |
| Comparative Example 2 | 120,000 | 15 | 350,000 | 0.244 |
| Comparative Example 3 | 5,000 | 3 | 5,500 | 0.530 |
| Comparative Example 4 | 20,000 | 15 | 30,000 | 0.182 |

Referring to Table 1, the weight average molecular weight of the inorganic polysilazane polymer solution of the polymers used in Examples 1 to 6 was in a range of 2,000 to 100,000, and a branching ratio thereof was in a range of 0.25 to 0.50.

The weight average molecular weight and branching ratio of the polymers used in Comparative Examples 1 and 2 were beyond the range, and the polymers used in Comparative Examples 3 and 4 had a weight average molecular weight within the range but a branching ratio beyond the range.

Evaluation 2: Evaluation of Layer Shrinkage and Layer Stress 3 cc of each inorganic polysilazane solution prepared in Examples 1 to 6 and Comparative Examples 1 to 4 was dropped onto a center of a wafer having a diameter of 8 inches using a spin coater (MS-A200, MIKASA Co., Ltd.), spin-coated at 1,500 rpm for 20 seconds, and heated and dried at 150° C. for 80 seconds using a hot plate. Then, thickness and stress of layers respectively formed of the solutions were measured by a reflection spectroscopic type layer thickness meter (ST-4000, K-MAC Technology Corp.) and a reflection spectroscopic type wafer shrinkage meter (FLX-2320-S, Toho Technology Inc.) and then, wet-cured at 600° C. for 1 hour. Then, thicknesses and stresses of the coated layers were measured.

Layer shrinkages of the layers were calculated according to Equation 2, and layer stresses of the layers were calculated according to Equation 3.

$$\text{Layer Shrinkage (\%)} = (\text{Layer thickness before wet curing} - \text{Layer thickness after wet curing})/(\text{Layer thickness before wet curing}) \times 100\% \quad \text{[Equation 2]}$$

$$\text{Layer stress (MPa)} = \text{Layer stress after wet curing} - \text{Layer stress before wet curing} \quad \text{[Equation 3]}$$

Evaluation 3: Wet Etch Rate 3 cc of each inorganic polysilazane solution prepared in Examples 1 to 6 and Comparative Examples 1 to 4 was dropped onto a center of a wafer having a diameter of 8 inches using a spin coater (MS-A200, MIKASA Co., Ltd.), spin-coated at 1,500 rpm for 20 seconds, and heated and dried at 150° C. for 80 seconds using a hot plate. Then, a wet curing process at 600° C. for 1 hour was performed. The wafer was cut in a coupon shape and dipped in a HF (hydrofluoric acid) solution for an appropriate time. Then, the cut cross-sections were measured using a SEM.

Evaluation 4: Gap-Fill Characteristics 3 cc of each inorganic polysilazane solution prepared in Examples 1 to 6 and Comparative Examples 1 to 4 was dropped onto a center of a wafer having a diameter of 8 inches using a spin coater (MS-A200, MIKASA Co., Ltd.), spin-coated at 1,500 rpm for 20 seconds, and heated and dried at 150° C. for 80 seconds using a hot plate. Then, a wet curing process at 600° C. for 1 hour was performed. The wafer was cut in a coupon shape and the cross-sections were measured using a SEM.

Results of Evaluations 2 to 4 are shown in Table 2.

TABLE 2

|  | Layer shrinkage (%) | Layer stress (MPa) | Wet etch rate (Å/s) | Gap-fill characteristics |
|---|---|---|---|---|
| Example 1 | 15.38 | 131 | 17.0 | good |
| Example 2 | 15.12 | 122 | 16.8 | good |
| Example 3 | 15.07 | 119 | 16.6 | good |
| Example 4 | 15.01 | 118 | 16.5 | good |
| Example 5 | 14.99 | 116 | 16.2 | good |
| Example 6 | 14.96 | 115 | 16.0 | good |
| Comparative Example 1 | 15.65 | 135 | 17.6 | good |
| Comparative Example 2 | 14.94 | 115 | 16.1 | inferior |
| Comparative Example 3 | 15.85 | 135 | 18.0 | good |
| Comparative Example 4 | 14.54 | 110 | 15.7 | inferior |

In Table 2, when there was no void, gap-fill characteristics were regarded to be 'good,' and when there was a void, gap-fill characteristics were regarded to be 'inferior.'

Referring to Table 2, layers respectively formed from the compositions including inorganic polysilazane having a predetermined branching ratio and a weight average molecular weight within the ranges according to Examples 1 to 6 showed sufficient gap-fill characteristics as well as excellent etch resistance, compared with the compositions according to Comparative Examples 1 to 4. In addition, the layers respectively formed from the compositions including inorganic polysilazane having a predetermined branching ratio and a weight average molecular weight within the ranges according to Examples 1 to 6 showed equivalent or sufficient layer shrinkage and layer stress, compared with the layers respectively formed from the compositions according to Comparative Examples 1 to 4.

By way of summation and review, an insulation layer may be formed between the semiconductor and the several electrodes to separate them. The insulation layer may be a silica layer including a silicon component. A silica layer may be formed by coating a polysilazane, a polysiloxazane, or a mixture thereof and converting the coating layer into an oxide film. Etch resistance in terms of film durability may be useful and simultaneously gap-fill characteristics in terms of coating properties may be useful to realize a uniform layer. These characteristics may have trade-off relationship with each other, and thus a material for forming a silica layer satisfying the properties simultaneously may be desirable.

The embodiments may provide a composition for forming a silica layer having a dense structure which may help reduce generation of a shrinkage or a stress of a layer and help improve etch resistance and simultaneously help ensure gap-fill characteristics.

A composition for forming a silica layer according to an embodiment may include the solid silicon-containing polymer having a predetermined weight average molecular weight and branching ratio.

Accordingly, a silica layer manufactured using the composition for forming a silica layer may have a dense structure, and a shrinkage and a stress of a layer may be reduced and etch resistance and planarization characteristics may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A composition for forming a silica layer, the composition comprising:
   a silicon-containing polymer; and
   a solvent,
   wherein a weight average molecular weight of the silicon-containing polymer is about 2,000 to about 100,000 and a branching ratio (a) of the silicon-containing polymer calculated by Equation 1 is about 0.25 to about 0.50:

$$\eta = k \cdot M^a \quad \text{[Equation 1]}$$

wherein, in Equation 1,
   $\eta$ is an intrinsic viscosity of the silicon-containing polymer,
   M is an absolute molecular weight of the silicon-containing polymer,
   a is the branching ratio, and
   k is an intrinsic constant.

2. The composition for forming a silica layer as claimed in claim 1, wherein the intrinsic viscosity of the silicon-containing polymer is about 3 mg/L to about 15 mg/L.

3. The composition for forming a silica layer as claimed in claim 1, wherein the absolute molecular weight of the silicon-containing polymer is about 2,000 g/mol to about 300,000 g/mol.

4. The composition for forming a silica layer as claimed in claim 1, wherein the silicon-containing polymer includes a polysilazane, a polysiloxazane, or a combination thereof.

5. The composition for forming a silica layer as claimed in claim 1, wherein the solvent includes benzene, toluene, xylene, ethylbenzene, diethylbenzene, trimethylbenzene, triethylbenzene, cyclohexane, cyclohexene, decahydronaphthalene, dipentene, pentane, hexane, heptane, octane, nonane, decane, ethylcyclohexane, methylcyclohexane, cyclohexane, cyclohexene, p-menthane, dipropylether, dibutylether, anisole, butyl acetate, amyl acetate, methylisobutylketone, or a combination thereof.

6. The composition for forming a silica layer as claimed in claim 1, wherein the silicon-containing polymer is included in the composition in an amount of about 0.1 wt % to about 30 wt %, based on a total weight of the composition for forming a silica layer.

7. A method of manufacturing a silica layer, the method comprising:
   coating the composition for forming a silica layer as claimed in claim 1 on a substrate,
   drying the substrate coated with the composition for forming a silica layer, and
   curing the composition for forming a silica layer at about 250° C. to about 1,000° C.

8. An electronic device comprising the silica layer as claimed in claim 7.

* * * * *